United States Patent
Takeuchi et al.

(10) Patent No.: US 6,770,965 B2
(45) Date of Patent: Aug. 3, 2004

(54) WIRING SUBSTRATE USING EMBEDDING RESIN

(75) Inventors: Hiroki Takeuchi, Komaki (JP); Toshifumi Kojima, Komaki (JP); Kazushige Ohbayashi, Nagoya (JP); Hisahito Kashima, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/026,454

(22) Filed: Dec. 27, 2001

(65) Prior Publication Data
US 2003/0047809 A1 Mar. 13, 2003

(30) Foreign Application Priority Data
Dec. 28, 2000 (JP) .................................... P.2000-401931
Aug. 27, 2001 (JP) .................................... P.2001-255781

(51) Int. Cl.[7] .......................... H05K 3/46; H01L 59/18; C08L 63/02; C08G 59/18; B32B 3/00
(52) U.S. Cl. ...................... 257/700; 257/701; 257/758; 257/774; 257/668; 257/680; 257/698; 428/209; 523/427; 523/428; 523/429; 523/434; 525/526; 525/109; 525/113; 525/423; 525/438
(58) Field of Search ..................... 257/701, 758, 257/774, 668, 680, 698, 700, 759, 782–790; 428/209; 523/427–429, 434; 525/526, 109, 113, 423, 438

(56) References Cited

U.S. PATENT DOCUMENTS

| | | | | |
|---|---|---|---|---|
| 4,572,853 A | * | 2/1986 | Ikeya et al. ................... 428/76 |
| 5,120,665 A | * | 6/1992 | Tsukagoshi et al. | |
| 5,137,940 A | * | 8/1992 | Tomiyoshi et al. .......... 523/220 |
| 5,656,862 A | * | 8/1997 | Papathomas et al. ....... 257/778 |
| 5,714,086 A | * | 2/1998 | Osuna et al. .......... 252/182.18 |
| 5,840,417 A | * | 11/1998 | Bolger ....................... 428/323 |
| 6,117,953 A | * | 9/2000 | Ichiroku et al. ............. 525/526 |
| 6,168,872 B1 | * | 1/2001 | Ohashi et al. .............. 428/620 |
| 6,200,830 B1 | * | 3/2001 | Ito et al. ..................... 438/106 |
| 6,265,782 B1 | * | 7/2001 | Yamamoto et al. ......... 257/783 |
| 6,376,053 B1 | * | 4/2002 | Nakamura et al. .......... 428/209 |
| 6,376,100 B1 | * | 4/2002 | Shiobara et al. ............ 428/620 |
| 6,376,923 B1 | * | 4/2002 | Sumita et al. .............. 257/791 |
| 6,429,238 B1 | * | 8/2002 | Sumita et al. .............. 523/461 |
| 6,512,031 B1 | * | 1/2003 | Honda et al. ................ 524/115 |
| 2002/0058756 A1 | * | 5/2002 | Konarski .................... 525/107 |
| 2002/0127418 A1 | * | 9/2002 | Takeuchi et al. ............ 428/457 |
| 2002/0132094 A1 | * | 9/2002 | Takeuchi et al. ............ 428/209 |
| 2002/0132096 A1 | * | 9/2002 | Takeuchi et al. ............ 428/210 |
| 2002/0147264 A1 | * | 10/2002 | Takeuchi et al. ............ 524/495 |
| 2002/0161100 A1 | * | 10/2002 | Kojima et al. .............. 524/492 |

FOREIGN PATENT DOCUMENTS

| | | |
|---|---|---|
| JP | 9-46046 A | 2/1997 |
| JP | 9-46046 * | 2/1997 |
| JP | 11-126978 A | 5/1999 |
| JP | 2000-124352 A | 4/2000 |

OTHER PUBLICATIONS

English abstract JP9046046, Feb. 14, 1997.
English abstract JP2000124352, Apr. 28, 2000.
English abstract JP11126978, May 11, 1999.

\* cited by examiner

*Primary Examiner*—Alexander Oscar Williams
(74) *Attorney, Agent, or Firm*—Sughrue Mion, PLLC

(57) ABSTRACT

A wiring substrate includes (1) an insulating substrate having an opening, or a core substrate and a build-up layer wherein at least one of the core substrate and the build-up layer has an opening, (2) at least one electronic part disposed in the opening, and (3) an embedding resin comprising a thermoplastic resin, an acid anhydride curing agent, a curing accelerator, and a filler, wherein the embedding resin shows a viscosity of not higher than 85 Pa·s in a shear rate of 8.4 $s^{-1}$ after allowing to stand for 24 hours at 25° C.±1° C.

6 Claims, 9 Drawing Sheets

WIRING SUBSTRATE USING EMBEDDING RESIN

BACKGROUND OF THE INVENTION

1. Field of the Invention

The present invention relates to an embedding resin for embedding electronic parts such as chip capacitors, chip inductors, chip resistances, etc., in the inside of a substrate and to a wiring substrate (wiring board) having electronic parts embedded in the inside of the substrate using the resin. Particularly, the invention is suitable for a multilayer wiring substrate, a package for containing (receiving) a semiconductor element, etc.

2. Description of the Related Art

Recently a multichip module (MCM) mounting many semiconductor elements on a build-up wiring substrate has been investigated. In the case of mounting electronic parts such as chip capacitors, chip inductors, chip resistances, etc., it is general to surface-mounting the electronic parts on a wiring layer for mounting formed on the surface of a wiring substrate using a solder.

However, when electronic parts are surface-mounted on the surface of a build-up wiring substrate, definite mounting area for various electronic parts is required, whereby there is, as a matter of course, a limit for the miniaturization. Also, by treating a wiring in the case of carrying out surface mounting, the occurrence of a parasitic inductance, which is undesirable for characteristics, is increased and there is a problem that the correspondence of electronic instruments to high frequency becomes difficult.

For solving these various problems, various methods or embedding electronic parts in the inside of a substrate have been investigated. For example, Japanese Patent Laid-Open No. 126978/1999 discloses a method of, after previously solder-mounting electronic parts to a wiring substrate having a transfer sheet made of a metal foil, transferring the electronic parts, but there remains a problem in the position precision, etc., at mounting. Also, Japanese Patent Laid-Open No. 124352/2000 disclosed a multilayer wiring substrate obtained by build-upping an insulating layer on electronic parts embedded in the inside of a core substrate.

In the method of embedding electronic parts in the inside of an insulating substrate such as a core substrate, etc., it is necessary that the gaps between the insulating substrate and the electronic parts are embedded with an embedding resin, and further a wiring layer formed on the insulating layer built-up thereon is electrically connected to the electrodes of the electronic parts by electroless plating, etc. In this case, for insuring the reliability of the connection, it is necessary to fill also fine gaps between the electrodes of the electronic parts with the embedding resin. For the purpose, it is necessary that the embedding resin has a low viscosity. Moreover, when the using environment is considered, it is necessary to prolong the usable time (the time of maintaining the good treating property of the embedding resin even when the curing reaction proceeds to some extent).

As a method of controlling the viscosity of the embedding resin, there are largely two methods. Practically, there are a method of controlling the addition amount of a filler and a method of using a curing agent having a slow curing rate.

In general, when the addition amount of a filler is reduced, the viscosity of the resin can be lowered. However, for preventing the occurrence of a trouble caused by the difference of the thermal expansion coefficient between materials, it is necessary to match the thermal expansion coefficient of the embedding resin with the expansion coefficient of a material, which becomes the core substrate or the build-up material to some extent. For the purpose, the addition of at least a definite amount of a filler is necessary. As described above, by only controlling the addition amount of filler, it was difficult to obtain both lowering the viscosity and obtaining the reliability.

SUMMARY OF THE INVENTION

An object of the invention is to provide an embedding resin capable of realizing both lowering of the viscosity and obtaining a high reliability by matching of thermal expansion coefficients.

Another object of the invention is to provide a wiring substrate wherein electronic parts disposed in the inside of an opening formed in an insulating substrate embedded therein using the embedding resin.

That is, the embedding resin of the invention is an embedding resin containing a thermoplastic resin, an acid anhydride curing agent, a curing accelerator, and a filler, wherein the viscosity thereof after allowing to stand for 24 hours at 25° C.±1° C. can be maintained at not higher 85 Pa·s in a shear rate of $8.4 \text{ s}^{-1}$.

Then, the invention is explained in detail.

About the embedding resin, when the using method thereof is considered, it is necessary to lower the viscosity thereof in one part liquid state of the mixture of the resin component, the acid anhydride curing agent, the curing accelerator, and the filler. In this case, when the workability such as filling property, etc., is considered, the embedding resin, which can maintain the viscosity thereof after allowing to stand for 24 hours at 25° C.±1° C. at not higher than 85 Pa·s, preferably not higher than 60 Pa·s, and more preferably not higher than 45 Pa·s in a shear rate of $8.4 \text{ s}^{-1}$, is preferred. More preferably, the embedding resin, which can maintain the viscosity thereof after allowing to stand for 48 hours at 25° C.±1° C. at not higher than 85 Pa·s, preferably not higher than 60 Pa·s, and more preferably not higher than 45 Pa·s in a shear rate of $8.4 \text{ s}^{-1}$, is preferred. By selecting the material, which can maintain the low viscosity for a long time, the increase of the viscosity during working at normal temperature can be restrained, whereby the occurrence of troubles such as inferior filling, etc., can be prevented and the yield can be improved.

The amount of the resin component (thermoplastic resin) is preferably 10 to 45 wt %, more preferably 10 to 23 wt %, based on the embedding resin.

As the curing agent, it is preferred to use the acid anhydride curing agent the viscosity of which at 25° C.±1° C. is not higher than 170 mPa·s, preferably not higher than 100 mPa·s, and more preferably not higher than 60 mPa·s. The acid anhydride curing agent is a material contributing to lower the viscosity of the embedding resin. By using the curing agent having the viscosity as low as possible, the viscosity of the embedding resin itself can be lowered. In addition, since the acid anhydride curing agent having a viscosity of not higher than 170 mPa·s shows the behavior as Newtonian flow different from the embedding resin, the viscosity is not largely fluctuated by the change of a shear rate. Accordingly, the viscosity of the curing agent may be measured by a shear rate different from the shear rate (8.4 $\text{s}^{-1}$) at measuring the embedding resin.

Also, by using the curing agent having a very low viscosity, even when the curing reaction of the embedding resin proceed to some extent, the curing agent can be used at the low viscosity. (that is, the usable time is long). As the result thereof, the effects of improving the workability and capable of preventing the entrance of bubbles at filling the embedding resin are obtained. Also, since by using the curing agent having a low viscosity, the viscosity of the embedding resin can be lowered, it is desirable to use the curing agent having a low viscosity.

As the acid anhydride curing agent, phthalic anhydride-base curing agents are preferred. Particularly, methyltetrahydrophthalic anhydride or methylhexahydrophthallic anhydride is preferred because of the high storage stability.

The amount of the curing agent is preferably 10 to 45 wt %, more preferably 10 to 26.5 wt %, based on the embedding resin.

The amount of the curing accelerator is preferably 0.02 to 3.5 wt %, based on the embedding resin.

In the embedding resin of the invention, by appropriately controlling the content of the filler, the filling property thereof can be more effectively improved. The preferred content of the filler is from 45 to 90% by weight, more preferably from 51 to 74% by weight, based on the embedding resin. When the compounding ratio of the filler is less than 45% by weight, the difference of The thermal expansion coefficient with the core substrate and the material becoming the build-up material becomes large, which causes the generation of cracks at applying a heat cycle. Also, when the content of the filler exceeds 90% by weight, the viscosity of the embedding resin becomes high and the filling property thereof is greatly deteriorated to cause the entrance of bubbles.

It is preferred that the embedding resin of the invention contains at least one kind of an inorganic filler to the resin component. The reasons for adding an inorganic A filler is for the control of the thermal expansion coefficient and further for preventing the form of the embedding resin after the roughening treatment from being crumbled by the effect as the aggregate obtained by the inorganic filler.

There is no particular restriction on the inorganic filler but crystalline silica, fused silica, alumina, silicon nitride, etc., are preferred. The inorganic filler can effectively lower the thermal expansion coefficient of the embedding resin, thereby the improvement of the reliability to heat cycle is obtained.

As to the filler size of the inorganic filler, for the necessity that the embedding resin easily flows in even the gaps between the electrodes of electronic parts, the filler having the particle sizes of not larger than 50 $\mu$m is preferably used. When the particle size of the filler exceeds 50 $\mu$m, the filler is liable to be clogged in the gaps between the electrodes of the electronic parts and by inferior filling of the embedding resin, the portions having extremely different thermal expansion coefficient generate locally. The lower limit of the particle size of the filler is preferably at least 0.1 $\mu$m. When the particle size of the filler is finer than 0.1 $\mu$m, the fluidity of the embedding resin becomes hard to be insured. Thus, the particle size of the filler is preferably at least 0.3 $\mu$m, and more preferably at least 0.5 $\mu$m. For attaining a low viscosity and a high filling of the embedding resin, it is preferred to widen the particle size distribution.

For increasing the fluidity and the filling of the embedding resin, the form of the inorganic filler is preferably an almost spherical form. In particular, a silica-base inorganic filler is preferred since the spherical filler can be easily obtained.

It is preferred that, if necessary, the surface of the inorganic filler is subjected to a surface treatment with a coupling agent. As the kind of the coupling agent, silane-base, titanate-base, aluminate-base, etc., are used.

In the wiring substrate having electric parts built-in using the embedding resin of the invention, the electric parts are disposed in the opening formed in an insulating substrate and gaps in the opening is embedded with the embedding resin of the invention. The term "electronic parts are embedded" in the invention means that after disposing electronic parts in an opening (a throughhole (shown, for example, in FIG. 2)) or a concave portion such as cavity (shown, for example, in FIG. 10) formed in a substrate such as a core substrate or a build-up insulating layer, the embedding resin is filled in the gaps formed between the opening and the electronic parts. Practically, a capacitor built-in type flip-chip package shown in FIG. 1 or FIG. 10 can be formed. In addition, not only the bump grid array type package but also a pin grid array type package can be formed. As the opening, a throughhole formed by punching the substrate or cavities, etc., formed by a multilayer technique can be preferably utilized. As the substrate, which is used in the invention, a so-called core substrate such as FR-4, FR-5, BT, etc., is preferably used but a core substrate formed by sandwiching a copper foil having a thickness of about 35 $\mu$m in thermoplastic resin sheets such as PTFE sheets, etc., and having formed an opening maybe used. Also, a substrate formed by alternately laminating an insulating layer and a wiring layer on at least one surface of a core substrate to form a build-up layer and having formed an opening penetrating the core substrate and the build-up layer can be used. In this case, even d multilayer wiring substrate of a capacitor build-in type as shown in FIG. 11, there is a merit that the thickness of a so-called glass-epoxy composite material (insulating substrate) can be thinned to about 400 $\mu$m, which is a half of 800 $\mu$m of an ordinary product, to make a low back substrate.

In addition, the above-described electronic parts include passive electronic parts such as a chip capacitor, a chip inductor, a chip resistance, a filer, etc.; active electronic parts such as a transistor, a semiconductor element, FET, low-noise amplifier (LNA), etc., and other electronic parts such as a SAW filter, a Lc filter, an antenna switch module, a coupler, a diplexer, etc.

By sufficiently insuring the usable time at normal temperature and using the embedding resin having a low viscosity, the fine gaps between the electrodes of the electronic parts can be sufficiently filled with the embedding resin. Therefore, the wiring substrate of the invention can be used as an electronic parts built-in type wiring substrate having a high reliability to heat cycle.

A multilayer wiring substrate, wherein a build-up layer formed by alternately laminating an insulating layer and a wiring layer is formed at least one surface of a core substrate, and a substrate having formed an opening such that the opening penetrates the core substrate and the build-up layer is used, may be preferably produced, for example, as follows (FIG. 11 to FIG. 25).

Figure 1:
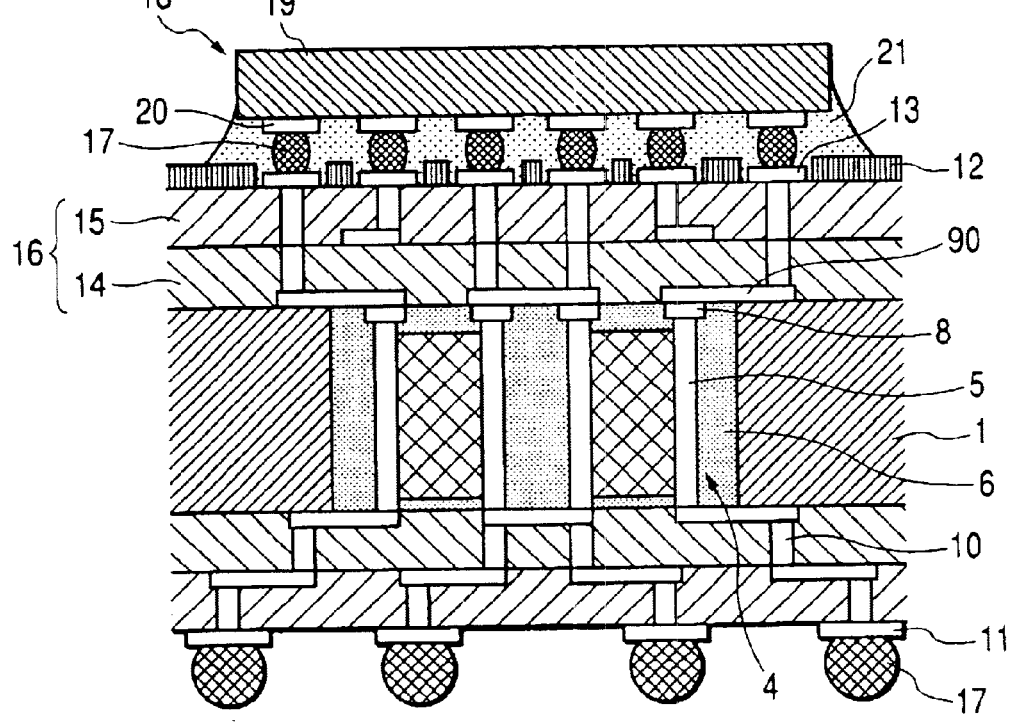
FIG. 1 is an explanatory view showing an example of applying the wiring substrate of the invention using the embedding resin of the invention to a BGA substrate.

The description of reference numerals in the drawings is set forth below.

| 1 | Core substrate |
| 2 | Throughhole (Opening) |
| 3 | Backing tape |

-continued

| 4 | Electronic part |
| 5 | Electrode of electronic part |
| 6 | Embedding resin |
| 60 | Flatted surface |
| 61 | Roughened surface |

DETAILED DESCRIPTION OF THE INVENTION

Figure 11:
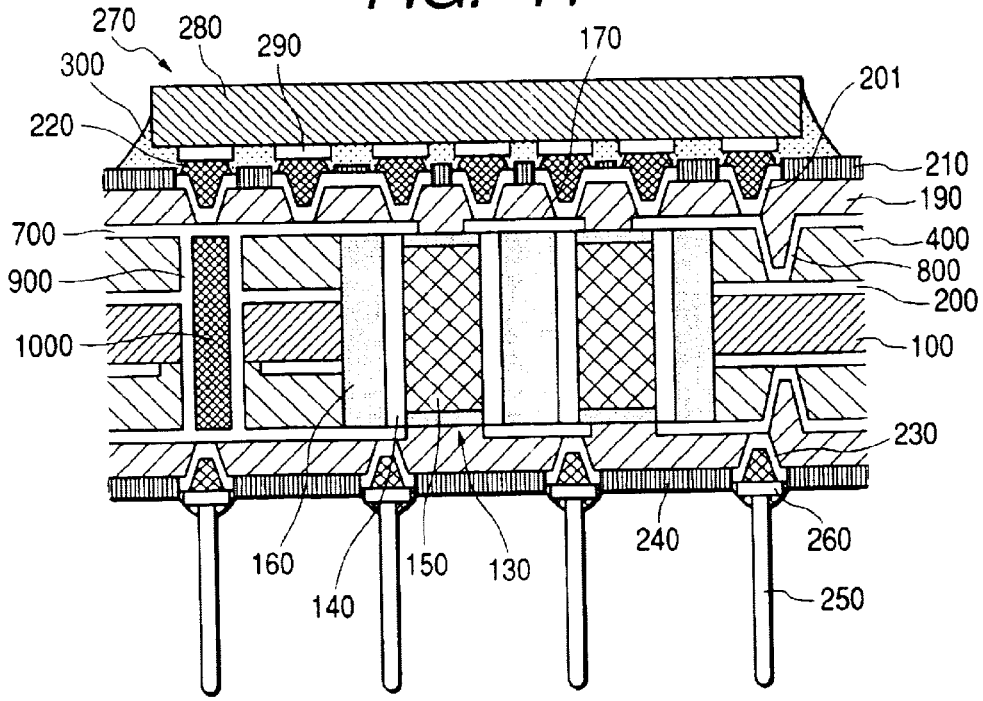
FIG. 11 is an explanatory view of a semiconductor device using an FC-PGA type multilayer printed wiring substrate, which is one embodiment of the invention.
Figure 12:
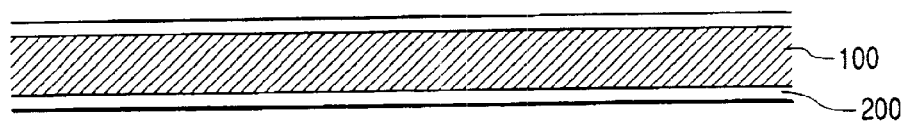
FIG. 12 is a schematic view of a 400 μm-thick copper-clad core substrate.

Now, the mode for carrying out the invention is explained below using an embodiment of so-called "FC-PGA" structure shown in FIG. 11. An FR-5-made double-sided copper-clad core substrate formed by sticking a copper foil (200) having a thickness of 18 μm to both surfaces of a core substrate (100) having a thickness of 0.4 mm as shown in FIG. 12 is prepared. About the characteristics of the core substrate used in the embodiment, the Ta (glass transition point) by TMA is 175° C., the CTE (thermal expansion coefficient) in the substrate plane direction is 16 ppm/° C., the CTE (thermal expansion coefficient) in the direction vertical to the substrate plane is 50 ppm/° C., the dielectric constant $\epsilon$ in 1 MHz is 4.7, and the tan $\delta$ in 1 MHz is 0.018.

Figure 13:
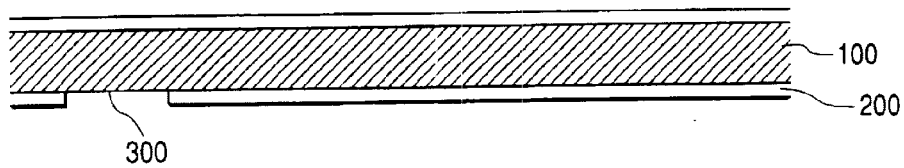
FIG. 13 is an explanatory view showing the state of after patterning a 400 μm-thick copper-clad core substrate.

A photoresist is stuck onto the core substrate followed by light exposure and development to form an opening (not shown) having a diameter of 600 μm and an opening (not shown) corresponding to a definite wiring form. The copper foil exposed to the opening of the photoresist is removed by etching using an etching solution containing sodium sulfite and sulfuric acid. Then, the photoresist film is removed by peeling to obtain the core substrate having formed the exposed portion (300) as shown in FIG. 13 and the opening (not shown) corresponding to the definite wiring form.

After surface-roughening the copper foil by applying an etching treatment using a commercially available etching treatment apparatus (CZ Treatment Apparatus, manufactured by MEC Co.), an insulating film made of an epoxy resin as the main body having a thickness of 35 μm is stuck to both surfaces of the core substrate. Also, the stuck films were cured under the conditions of 170° C.×1.5 hours to form insulating layers. About the characteristics of the insulating layer after curing, the Tg (glass transition point) by TMA is 155° C., the Tg (glass transition point) by DMA is 204° C., the CTE (thermal expansion coefficient) is 66 ppm/° C., the dielectric constant $\epsilon$ in 1 MHz is 3.7, the tan $\delta$ in 1 MHz is 0.033, the weight loss at 300° C. is −0.1%, the water absorption is 0.8%, the moisture absorption is 1%, the Young's modulus is 3 GHz, the tensile strength is 63 MPa, and the elongation percentage is 4.6%.

Figure 14:
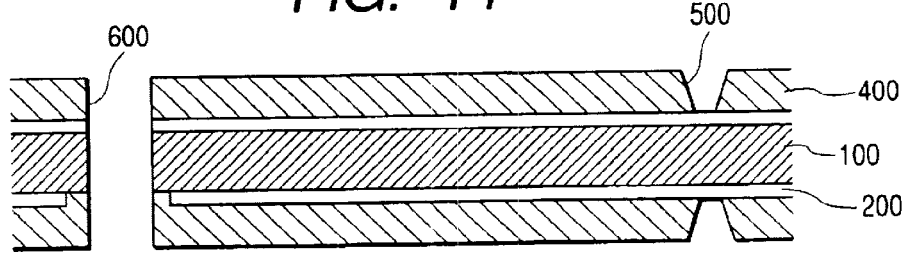
FIG. 14 is an explanatory view showing the state of forming via holes and a throughhole in a substrate having formed an insulating layer on both surfaces of the core substrate.

As shown in FIG. 14, using a carbon dioxide gas laser, via holes (500) for interlayer connection are formed in the insulating layer (400). The form of the via hole is a cone shape having the diameter of the surface layer portion of 120 μm and the diameter of the bottom portion of 60 μm. Furthermore, by increasing the output of the carbon dioxide gas laser, a throughhole (600) having a diameter of 300 μm is formed such that the hole penetrates the insulating layers and the core substrate. The inner wall surface of the throughhole has an undulation (not shown) specific to laser working. Also, after dipping the substrate in a catalyst activation liquid containing palladium chloride, electroless copper plating is applied to the whole surface (not shown).

Then, a copper panel deposition (700) having a thickness of 18 μm is plated on the whole surfaces of the substrate. Here, a via-hole conductor (800) electrically connecting between layers is formed on the walls of the via-hole (500). Also, a throughhole conductor (900) electrically connecting the front surface and the back surface of the substrate is formed on the wall of the throughhole (600). Then, by applying an etching treatment using a commercially available etching treatment apparatus (CZ Treatment Apparatus, manufactured by MEC Co.), the surfaces of the copper plating (depositions) are surface-roughened. Thereafter, by applying a rust-preventing treatment (CZ Treatment, trade name of MEC Co.) with a rust-preventing agent (manufactured by the same company), a hydrophobic surface is formed to complete the hydrophobic treatment. When the contact angle 2θ of the conductive layer surface subjected to the hydrophobic treatment to water was measured by a liquid drop method using a contact angle-measuring device (CA-A, trade name, manufactured by Kyowa Interface Science Co., Ltd.), the contact angle 2θ was 101 degree.

A nonwoven paper is placed on a pedestal equipped with a vacuum suction apparatus, and the above-described substrate is disposed on the pedestal. A stainless steel-made stopgap mask having a throughhole is placed thereon so that it corresponds to the position of the throughhole. Then, a paste for filling throughhole containing a copper filler is placed and while pressing a roller type squeegee, stopgap filling is carried out.

Figure 15:
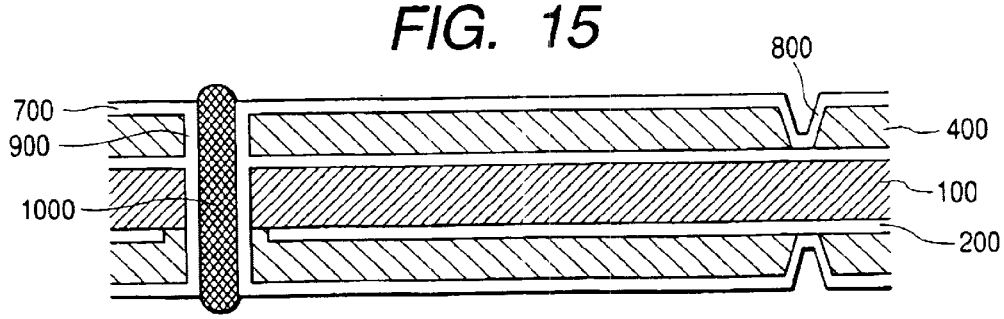
FIG. 15 is an explanatory view showing the state after applying panel plating to a substrate having formed an insulating layer on both surfaces of the core substrate.
Figure 16:
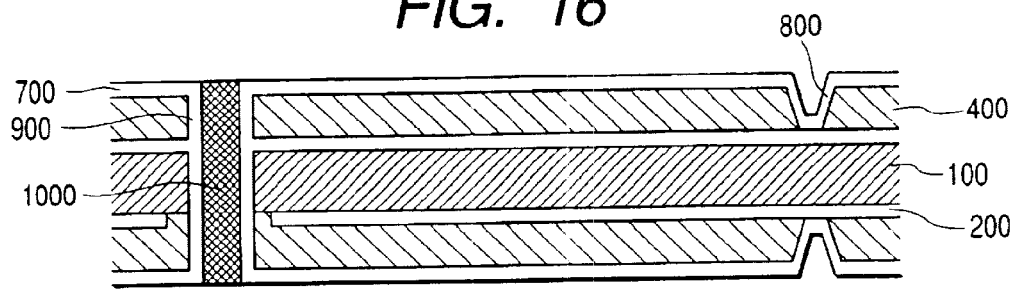
FIG. 16 is an explanatory view of a substrate wherein an embedding resin is filled in the throughhole.

As shown in FIG. 15, the throughhole-filling paste (1000) filled in the thorough hole (600) is pre-cured under the conditions of 120° C.×20 minutes. Then, as shown in FIG. 16, after abrading (rough abrading) the surface of the substrate using a belt sander, the surface is buffed (finish abrading) to flat the surface and cured under the conditions of 150° C.×5 hours to complete the stopgap step. In addition, a part of the substrate thus completed the stopgap step is used for the evaluation test of the stopgap property.

Figure 17:
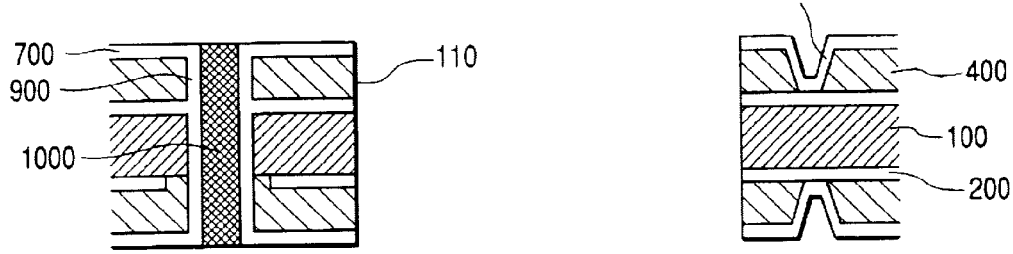
FIG. 17 is an explanatory view showing a substrate wherein a throughhole is formed by punching.
Figure 18:
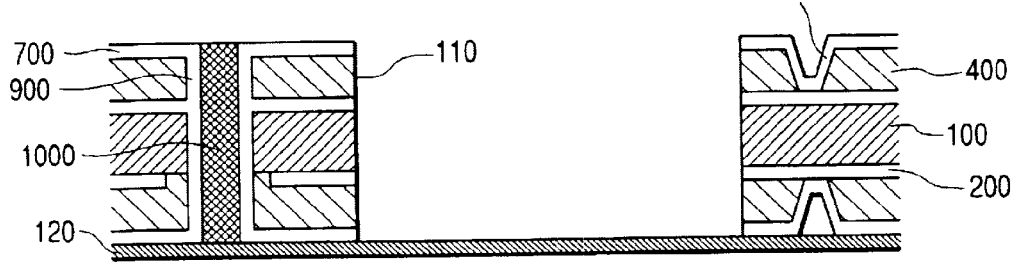
FIG. 18 is an explanatory view showing the state of sticking a masking tape to one surface of a substrate wherein a throughhole is formed by punching.
Figure 19:
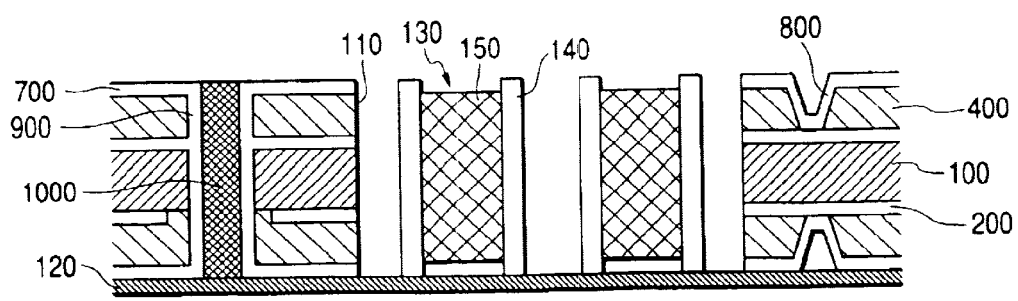
FIG. 19 is an explanatory view showing the state of disposing laminated chip capacitors on the masking tape exposed in the throughhole.

As shown in FIG. 17, a throughhole of 8 mm square (opening (110)) is formed using a metal mold (not shown). As shown in FIG. 18, a masking tape (120) is stuck to one surface of the substrate. Also, as shown in FIG. 19, eight laminated chip capacitors (130) are disposed on the masking tape exposed in the throughhole (110) using a chip mounter. The laminated chip capacitor is made of a laminate (150) of 1.2 mm×0.6 mm×0.4 mm and electrodes (140) are projected by 70 µm from the laminate.

Figure 20:
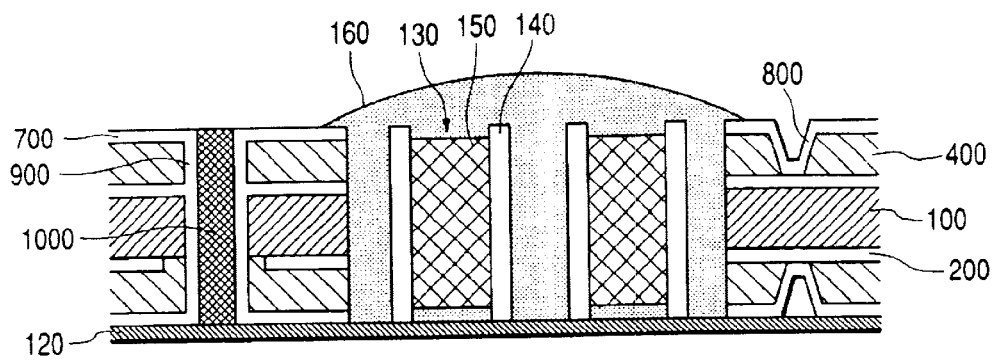
FIG. 20 is an explanatory view showing the state of filling the embedding resin in the throughhole.

As shown in FIG. 20, in the throughhole (110) having disposed therein the laminated chip capacitors (130), the embedding resin (160) of the invention is filled using a dispenser (not shown). The embedding resin is defoamed and thermally cured under the conditions of 80° C.×3 hours in the first heating step and 170° C.×6 hours in the second heating step.

Figure 21:
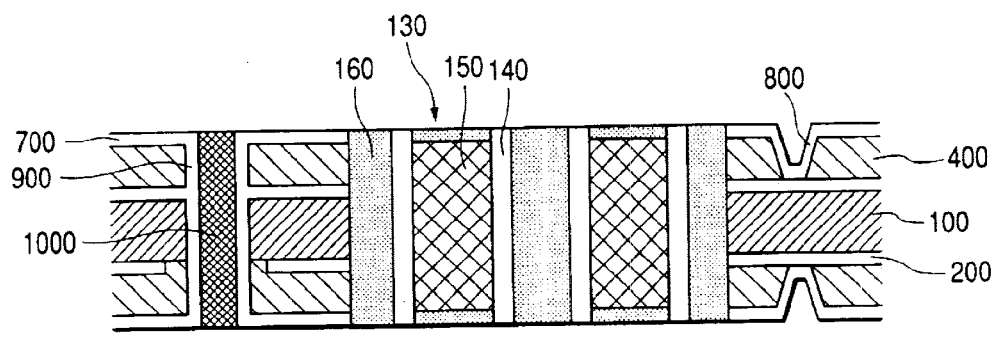
FIG. 21 is an explanatory view showing the state of flatted substrate surface by abrading.

As shown in FIG. 21, after roughly abrading the surface of the cured embedding resin (160) using a belt sander, the surface is finish-abraded by lap abrading. The end portions of the electrodes (140) of the chip capacitor (130) are exposed to the abrade surface. Then, the pre-cured embedding resin (160) is cured under the conditions of 150° C.×5 hours.

Figure 22:
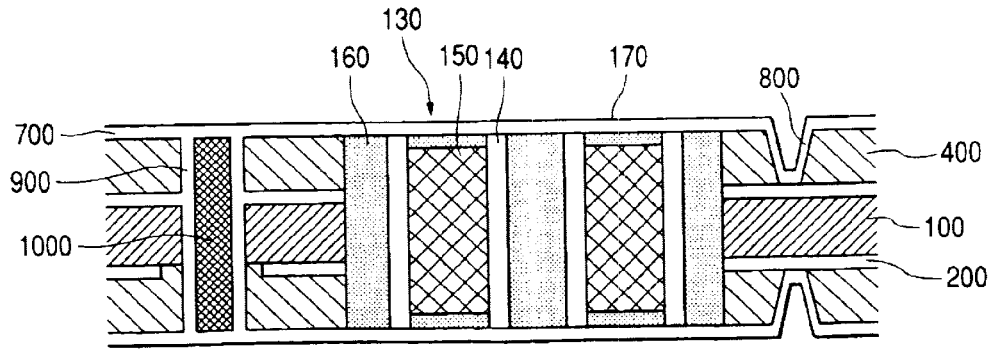
FIG. 22 is an explanatory view showing the state of applying panel plating onto the abraded surface of the substrate.
Figure 23:
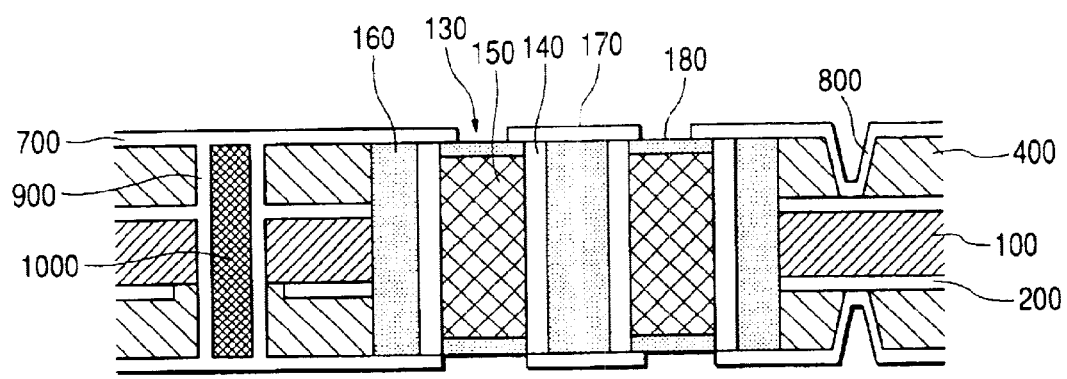
FIG. 23 is an explanatory view showing the state of patterning wiring.

Thereafter, the abraded surface of the embedding resin (160) is roughened using a swelling solution and a solution of $KMnO_4$. After Pt catalyst activating the roughened surface, copper plating is applied in the order of electroless plating and electrolytic plating. As shown in FIG. 22, the plated layer (170) formed on the embedding resin (160) is electrically connected to the end portions of the electrodes (140) of the chip capacitors (130). A resist (not shown) is formed on the plated surface and definite wiring patterns are formed thereon. Unnecessary copper is removed by etching using $Na_2S_2O_8$/concentrated sulfuric acid. The resist is peeled off to complete the formation of wiring as shown in FIG. 23. By applying an etching treatment by a commercially available etching treatment apparatus (CZ Treatment Apparatus, manufactured by MEC Co.), the copper-placed surface of wiring is roughened.

Figure 24:
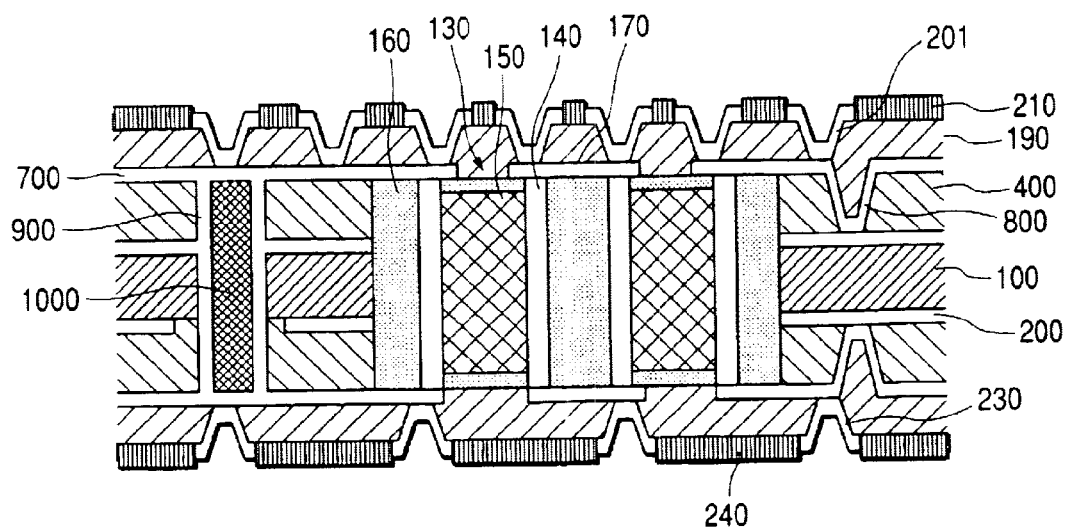
FIG. 24 is an explanatory view showing the state of forming a build-up layer and a solder resist layer on the substrate.

A film (190), which becomes an insulating layer, is laminated thereon and after thermally curing, a carbon dioxide gas laser is irradiated to form via holes for interlayer connection. The surface of the insulating layer is roughened using the same oxidizing agent as described above, and definite wirings (201) are formed by the same manner as described above. A dry film, which becomes a solder resist layer, is laminated on the uppermost surface of the wiring substrate, the mounting pattern of a semiconductor element is formed by light exposing and developing to complete the formation of a solder resist layer (210). On the back side to which pins for mounting are attached, a definite wiring (230) and a solder resist layer (240) are formed by the same method as above, whereby a multilayer printed wiring substrate before attaching pins as shown in FIG. 24 is obtained.

To terminal electrodes (201), onto which a semiconductor element is mounted, is applied plating (not shown) in the order of Ni plating and Au plating. After printing thereon a solder paste made of a low-melting solder, the substrate is passed through a solder reflow furnace to form solver bumps (220) for mounting a semiconductor element.

Figure 25:
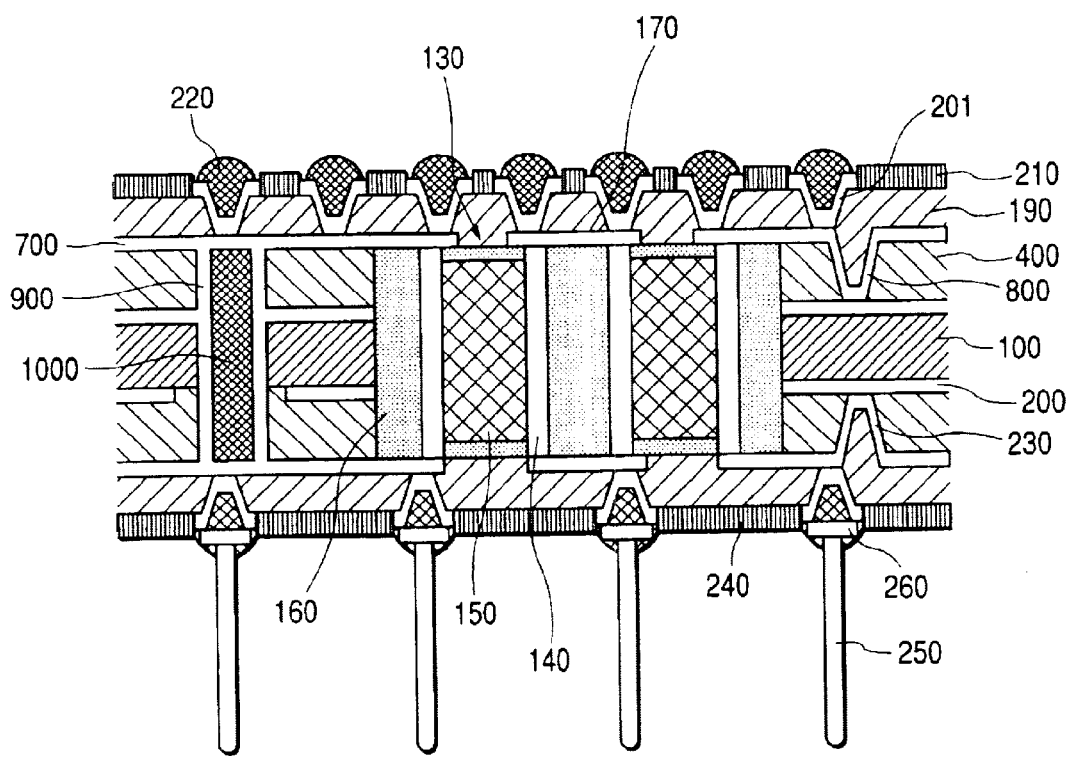
FIG. 25 is an explanatory view of an FC-PGA type multilayer printed wiring substrate, which is one embodiment of the invention.

On the other hand, on the opposite side of the semiconductor element-mounted surface, after printing a solder paste made of a high-melting solder, solder bumps (260) for attaching pins by passing through a solder reflow furnace are formed. In a state that the substrate is disposed one the pins (250) set to a jig (not shown), the pins are attached by passing through a solder reflow furnace (not shown), and, as shown in FIG. 25, an FC-PGA type multilayer printed wiring substrate before mounting a semiconductor element is obtained. When the positional deviation from the definite position of the tip of the pin (250) attached to the region corresponding to the opening (110) embedded with the embedding resin (160) was measured using a protector, a good result or not larger than 0.1 mm was obtained.

A semiconductor element (270) is disposed on a semiconductor element-mounting surface at the position capable of mounting and the assembly is passed through a solder reflow furnace in a temperature condition of melting a low-melting solder (220) only to mount the semiconductor element (270). After filling the mounted portion with an under-filling material (300) by a dispenser, thermal curing is carried out to obtain a semiconductor device using the FC-PGA type multilayer printed wiring substrate having mounted on the surface thereof the semiconductor element as shown in FIG. 11.

Figure 2:
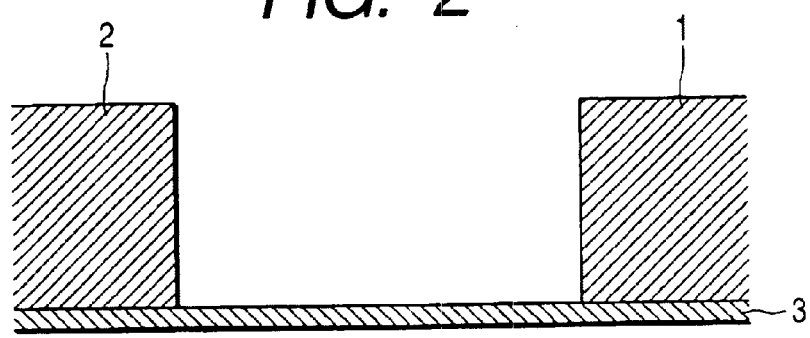
FIG. 2 is an explanatory view showing one embodiment of the production method of the wiring substrate using the embedding resin of the invention.

Then, an embodiment of other production method of a wiring substrate of the invention is explained. Here, the wiring substrate shown in FIG. 1 is illustrated. As shown in FIG. 2, a throughhole 2 having a definite size is formed in a core substrate (1) using a metal mold, and after sticking a backing tape (3) to one surface of the core substrate, the core substrate is placed with the surface having the backing tape at the lower side.

Figure 3:
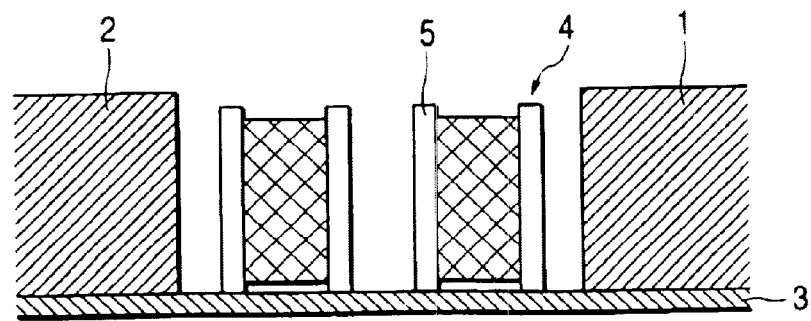
FIG. 3 is an explanatory view showing one embodiment of the production method of the wiring substrate using the embedding resin of the invention.
Figure 4:
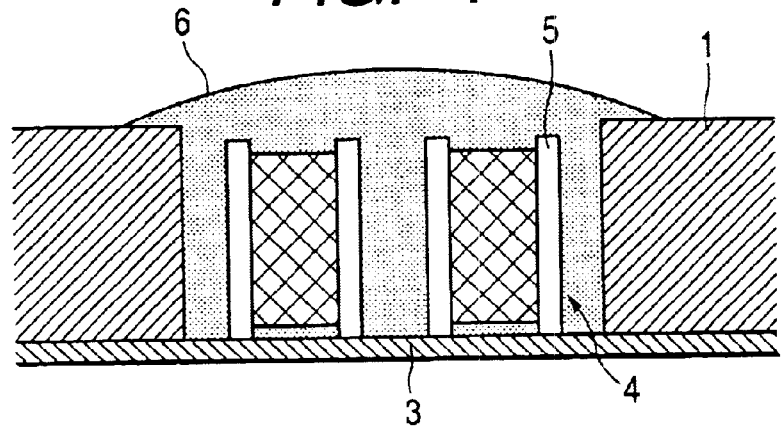
FIG. 4 is an explanatory view showing one embodiment of the production method of the wiring substrate using the embedding resin of the invention.

As shown in FIG. 3, from another side of the core substrate, chip capacitors (4) are disposed on a definite position on the sticky surface of the backing tape (3) in the throughhole (opening: 2) using a chip mounter. As the chip capacitor used in the case, it is preferred to use a chip capacitor having electrodes (5) projected from the capacitor main body so that the embedding resin can easily fill. As shown in FIG. 4, the embedding resin of the invention (6) is poured into the gaps among the chip capacitors (4) disposed in the opening (2) and the opening using a dispenser.

Figure 5:
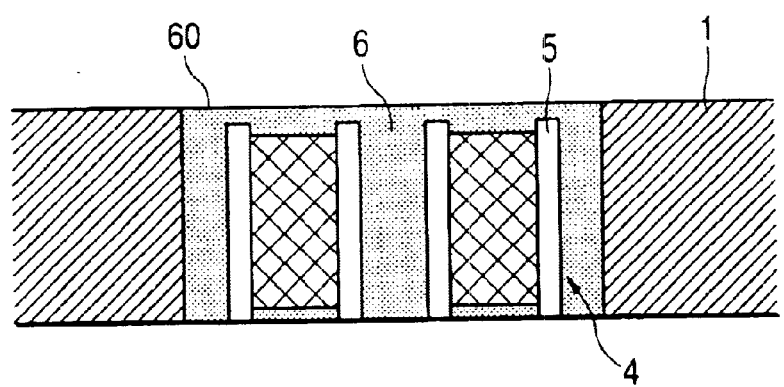
FIG. 5 is an explanatory view showing one embodiment of the production method of the wiring substrate using the embedding resin of the invention.
Figure 6:
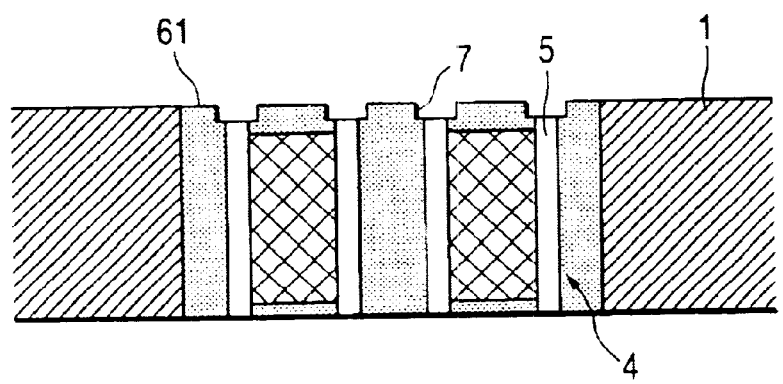
FIG. 6 is an explanatory view showing one embodiment of the production method of the wiring substrate using the embedding resin of the invention.

The embedding resin (6) is defoamed and thermally cured under the conditions of 100° C.×80 minutes→120° C.×60 minutes→160° C.×10 minutes. After roughly abrading the surface of the cured embedding resin using a belt sander, the surface was finish-abraded by a rap abrasion. The surface (60) of the embedding resin (6) the abrasion is shown in FIG. 5. Then, as shown in FIG. 6, via holes (7) are formed using a carbon dioxide gas laser to expose the electrodes (5) of the chip capacitors (4).

Figure 7:
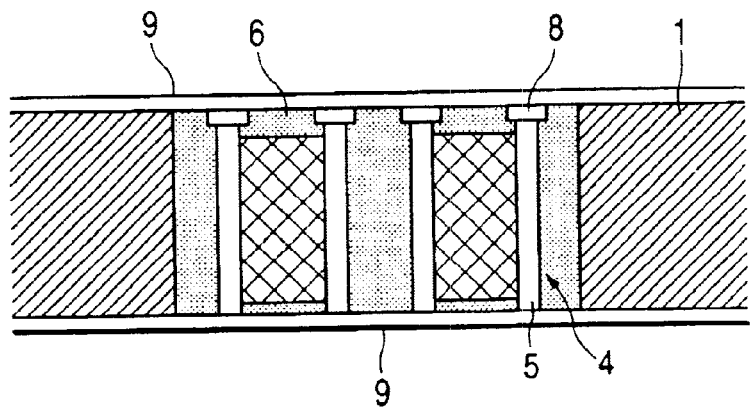
FIG. 7 is an explanatory view showing one embodiment or the production method of the wiring substrate using the embedding resin of the invention.
Figure 8:
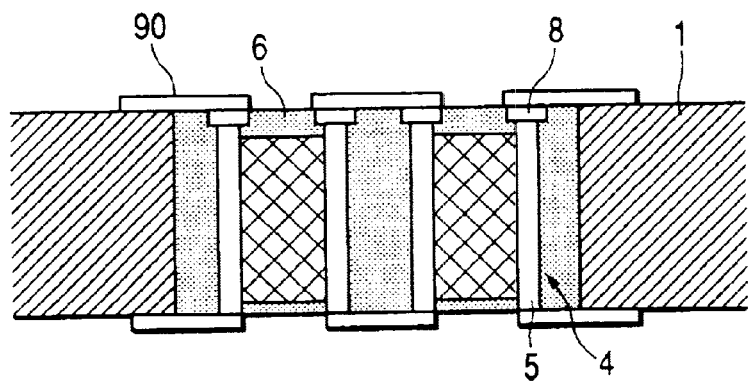
FIG. 8 is an explanatory view showing one embodiment of the production method of the wiring substrate using the embedding resin of the invention.

Thereafter, using a swelling solution and a solution of $KMnO_4$, the exposed surfaces (61) of the embedding resin (6) are roughened. After Pd catalyst activating the roughened surface, copper plating (8,9) is applied in the order of electroless plating and electrolytic plating. The state after copper plating is shown in FIG. 7. A resist (not shown) is formed on the plated surface and a definite wiring pattern is formed by patterning. Unnecessary copper is removed by etching using $Na_2S_2O_8$/concentrated sulfuric acid. The resist is peeled off to complete the formation of a wiring layer (90). The state after forming the wiring layer is shown in FIG. 8.

Figure 9:
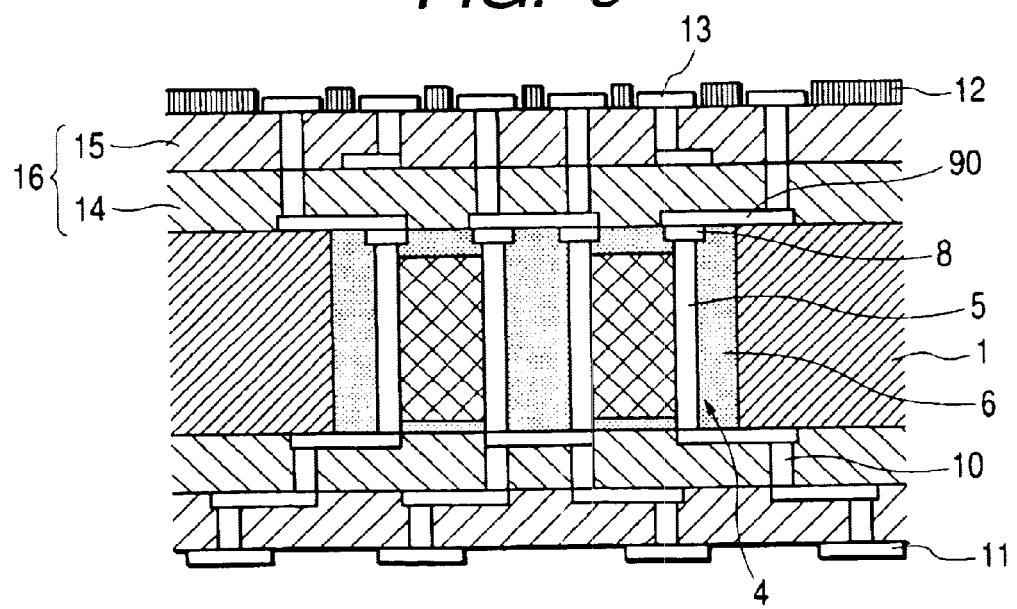
FIG. 9 is an explanatory view showing one embodiment of the production method of the wiring substrate using the embedding resin of the invention.
Figure 10:
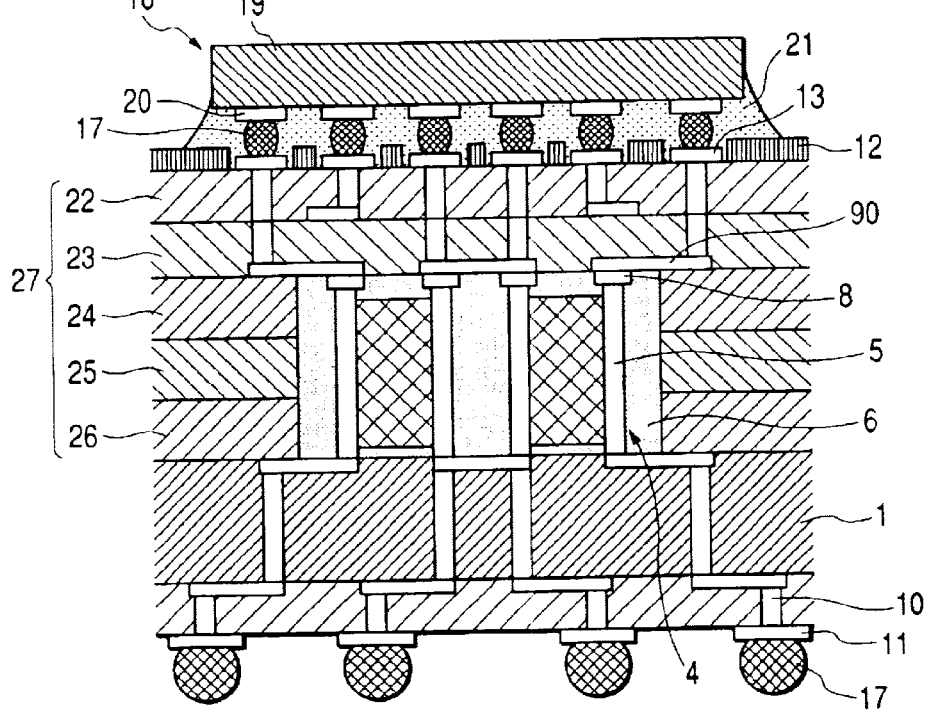
FIG. 10 is an explanatory view showing an example of applying the wiring substrate using the embedding resin of the invention to a BGA substrate.

After laminating thereon films (14, 15), which become insulating layers, and thermally curing, a laser is irradiated to form via holes for interlayer connecting. The surface of the insulating layer is roughened using the same oxidizing agent and then a definite wiring pattern is formed by the same manner as above. A dry film, which becomes a solder resist layer, is laminated on the uppermost surface of the wiring substrate, the mounting pattern of a semiconductor element is formed by light exposing and developing to form a solder resist layer (12). The state is shown in FIG. 9. To the terminal electrodes (13) for mounting a semiconductor element, plating is applied in the order of Ni plating and Au plating. Thereafter, By passing through a solder reflow furnace, a semiconductor element (18) is mounted. On the electrodes for carrying out mounting of the substrate, solder balls (17) are formed using a low-melting solder. After filling an under filling material (21) in the mounting portions by a dispenser, the material is thermally cured to complete the preparation of the desired wiring substrate as shown in FIG. 1.

Then, the effects by the wiring substrate of the present invention are explained by the examples using the evaluation samples. The embedding resin is prepared by mixing the components such as the compositions shown in Table 1 are obtained and kneading the mixture by a triple roll mill. The details of the described matters in Table 1 are shown below.

Epoxy Resin

"HP-4032D": High-pure naphthalene type epoxy resin (manufactured by DAINIPPON INK & CHEMICALS, INC.)

Curing Agent

"QH-200" (40 mPa·T·s): Acid anhydride-base curing agent (manufactured by Zeon Corp.)

"B-570" (40 mPa·s): Acid anhydride-base curing agent (manufactured by DIC)

"B-650" (65 mPa·s): Acid anhydride-base curing agent (manufactured by DIC)

"YH-307" (200 mPa·s): Acid anhydride-base curing agent (manufactured by Yuka Shell Epoxy Co., Ltd.)

"YH-306" (120 mPa·s): Acid anhydride-base curing agent (manufactured by Yuka Shell Epoxy Co., Ltd.)

"YH-300" (40 mPa·s): Acid anhydride-base curing agent (manufactured by Yuka Shell Epoxy Co., Ltd.)

"KAYAHARD NCD" (250 mPa·s): Acid anhydride-base curing agent (manufactured by NIPPON KAYAKU CO., LTD.)

Accelerator (Curing Accelerator)

Imidazole-base curing agent (manufactured by Shikoku Chemicals Corporation)

Inorganic Filler

"TSS-6": Silane coupling treated (manufactured by Tatsumori Ltd., the largest particle size by particle size distribution 24 $\mu$m)

"The filler content" and "the carbon content" are the values when epoxy+curing agent+filler are 100%. The content of "the accelerator" is defined to be 0.2 when epoxy+ curing agent+filler are 100%. The ratio of the epoxy resin and the curing agent is defined to by 100/95 by the functional group ratio. These compositions are subjected to the following evaluations.

Evaluation of Reliability

As the core substrate, a BT substrate having a thickness of 0.9 mm is used. A throughhole of a definite size is formed in the core substrate using a metal mold. After sticking a backing tape to one surface of the core substrate, the substrate is placed with backing tape stuck surface at the lower side. From the other side, chip capacitors are disposed at the definite position of the sticky surface of the backing tape in the opening using a chip mounter. In the gaps between the chip capacitors disposed in the opening and the opening is poured the embedding resin shown in Table 1 using a dispenser.

The embedding resin is defoamed and thermally cu conditions of 100° C.×80 minutes→160° C.×10 minutes, After roughly abrading the surface of the cured embedding resin using a belt sander, the surface is finish-abraded using a rap abrasion. Then, via holes (7) are formed using a carbon dioxide gas laser to expose the electrodes of the chip capacitors.

Thereafter, the exposed surface of the embedding resin is roughened using a swelling liquid and a solution of $KMnO_4$. After Pd catalyst activating the roughened surface, copper plating is applied in the order of electroless plating and electrolytic plating. A resist is formed on the plated surface and a definite wiring pattern is formed by patterning. Unnecessary copper is removed by etching using $Na_2S_2O_8$/ concentrated sulfuric acid. The resist is peeled off to complete the form of wiring.

A film, which becomes an insulating layer, is laminated thereon and after thermally curing, a laser is irradiated to form via holes for interlayer connection. The surface of the insulating layer is roughened using the same oxidizing agent and a definite wiring pattern is formed by the same manner as above to complete the preparation of a sample for evaluation.

In this case, for each of sample numbers 1 to 9 as the embedding resin, the embedding resins after passing 4 hours, 6 hours, 8 hours, 24 hours, and 48 hours since the preparation of each resin are prepared, each sample using each of the embedding resins is prepared and the embedding property is evaluated. About the pass-fail standard, by an appearance inspection by a magnifying lens, the sample having at least 95% of cavities having no foams is evaluated as passed or acceptable. If necessary, after removing the build-up layer by abrasion so that damage is not given to the embedding resin, the state of the embedding resin may be observed. In Table 2, the passed sample is shown by 0 and the failed sample is shown by x.

Also, about the embedding resins of sample numbers 10 to 15, a thermal shock test (test conditions are −55° C.~125° C.×300 cycles (2 cycles/one hour) is carried out and the evaluation of the thermal shock resistance is carried out. In regard to the pass-fail evaluation standard, the sample, wherein the crack-generating ratio is 5% or lower and passed in the appearance inspection by a magnifying lens, is evaluated as a passed sample about the thermal shock resistance. If necessary, after removing the build-up layer by abrasion so that damage is not given to the embedding resin, the state of the embedding resin may be observed. In Tables 2 and 3, the passed sample is shown by 0 and the failed sample is shown by x.

TABLE 1

| Sample No. | Epoxy Resin (wt %) | Curing Agent (wt %) | Accelerator (wt %) | Filler (TSS-6) Content (wt %) |
|---|---|---|---|---|
| 1 | HP-4032D (16.3) | QH-200 (18.7) | 2P4MHZ (0.2) | 65 |
| 2 | HP-4032D (16.2) | B-570 (18.8) | 2P4MHZ (0.2) | 65 |
| 3 | HP-4032D (16.1) | B-650 (18.9) | 2P4MHZ (0.2) | 65 |
| 4 | HP-4032D (14.3) | YH-307 (20.7) | 2P4MHZ (0.2) | 65 |
| 5 | HP-4032D (13.5) | YH-306 (21.5) | 2P4MHZ (0.2) | 65 |
| 6 | HP-4032D (16.7) | YH-300 (18.3) | 2P4MHZ (0.2) | 65 |
| 7 | HP-4032D (16.5) | MCD (18.5) | 2P4MHZ (0.2) | 65 |
| 8 | HP-4032D (14.7) | B-306 (23.3) | 2P4MHZ (0.2) | 62 |
| 9 | HP-4032D (17.9) | MCD (20.1) | 2P4MHZ (0.2) | 62 |
| 10 | HP-4032D (23.1) | B-570 (26.8) | 2P4MHZ (0.2) | 50 |
| 11 | HP-4032D (20.9) | QH-200 (24.1) | 2P4MHZ (0.2) | 55 |
| 12 | HP-4032D (18.5) | B-570 (21.5) | 2P4MHZ (0.2) | 60 |
| 13 | HP-4032D (16.1) | B-650 (18.9) | 2P4MHZ (0.2) | 65 |
| 14 | HP-4032D (11.6) | YH-306 (18.4) | 2P4MHZ (0.2) | 70 |
| 15 | HP-4032D (11.9) | YH-300 (13.1) | 2P4MHZ (0.2) | 75 |

TABLE 2

| Sample No. | Viscosity of Curing Agent (mPa·s) | Emb. Resin After 4 hrs (Pa·s) Pass-fail | Emb. Resin After 6 hrs (Pa·s) Pass-fail | Emb. Resin After 8 hrs (Pa·s) Pass-fail | Emb. Resin After 24 hrs (Pa·s) Pass-fail | Emb. Resin After 48 hrs (Pa·s) Pass-fail |
|---|---|---|---|---|---|---|
| 1 | 40 | 17 ○ | 22 ○ | 22 ○ | 39 ○ | 46 ○ |
| 2 | 40 | 18 ○ | 21 ○ | 28 ○ | 36 ○ | 46 ○ |
| 3 | 55 | 20 ○ | 28 ○ | 29 ○ | 42 ○ | 58 ○ |
| 4 | 200 | 62 ○ | 69 ○ | 76 ○ | 106 x | 160 x |
| 5 | 180 | 34 ○ | 35 ○ | 36 ○ | 49 ○ | 89 x |
| 6 | 40 | 23 ○ | 25 ○ | 30 ○ | 36 ○ | 52 ○ |
| 7 | 250 | 59 ○ | 59 ○ | 61 ○ | 88 x | 128 x |
| 8 | 167 | 30 ○ | 31 ○ | 34 ○ | 45 ○ | 85 ○ |
| 9 | 170 | 37 ○ | 39 ○ | 46 ○ | 84 ○ | 120 x |

Emb. Resin: Embedding Resin
Pass-fail: Pass-fail of embedding

TABLE 3

| Sample No. | Filler Content (%) | Crack Generating Ratio (%) | Thermal Shock Resistance | Pass-Fail of Embedding |
|---|---|---|---|---|
| 10 | 50 | 10 | x | ○ |
| 11 | 55 | 5 | ○ | ○ |
| 12 | 60 | 3 | ○ | ○ |
| 13 | 65 | 2 | ○ | ○ |
| 14 | 70 | 1 | ○ | ○ |
| 15 | 75 | 3 | ○ | x |

From the above results, it can be seen that in the samples of the examples using the embedding resins of the invention, good results are obtained. On the other hang, in material numbers 4, 5, 7, and 9 of the comparative examples, in which the viscosity of the curing agents exceeds 170 mPa·s, after allowing to stand for 48 hours, the viscosity exceeded 85 mPa·s, which resulted in the deterioration of the filling property.

It can be seen that according to the invention, an embedding resin having a good embedding property and capable of enduring the use of a long time at normal temperature and the wiring substrate using the embedding resin are obtained. By previously lowering the viscosity of the embedding resin than a definite value, the embedding property, etc., can be improved. Also, by using the acid anhydride curing agent having a lower viscosity than a definite value, the viscosity of the embedding resin can be easily lowered.

This application is based on Japanese patent applications JP 2000-401931, filed Dec. 28, 2000, JP 2001-255781, filed Aug. 28, 2001, and JP 2001-352478, filed Nov. 19, 2001, the entire contents of each of which are hereby incorporated by reference, the same as if set forth at length.

What is claimed is:

1. A wiring substrate comprising:
   (1) an insulating substrate having an opening; at least one electronic part disposed in the opening; and an embedding resin comprising a thermoplastic resin, an acid anhydride curing agent, a curing accelerator, and a filler having a particle size of from 0.1 to 50 μm in an amount of from 51 to 74% by weight, wherein the at least one electronic part is embedded with the embedding resin which shows, before embedding, a viscosity of not higher than 85 Pa·s in a shear rate of 8.4 s$^{-1}$ after being allowed to stand for 24 hours at 25° C.±1° C.;

(2) an insulating layer covering the opening;

(3) a terminal electrode for mounting a semiconductor element, wherein the semiconductor element is on a surface of the wiring substrate; and (4) via holes penetrating the insulating layer and connecting the terminal electrode to the embedded electronic part.

2. A wiring substrate comprising:

(1) a core substrate;

(2) build-up layer provided on at least one side of the core substrate and formed by alternately laminating an insulating layer and a wiring layer, wherein at least one of the core substrate and the building-up layer has an opening penetrating therethrough, and an electronic part is disposed in the opening and embedded with an embedding resin comprising a thermoplastic resin, an acid anhydride curing agent, a curing accelerator, and a filler having a particle size of from 0.1 to 50 μm in an amount of from 51 to 74% by weight, wherein the embedding resin shows, before embedding, a viscosity of not higher than 85 Pa·s in a shear rate of 8.4 s$^{-1}$ after being allowed to stand for 24 hours at 25° C.±1° C.;

(3) another insulating layer covering the opening;

(4) a terminal electrode for mounting a semiconductor element, wherein the semiconductor element is on a surface of the wiring substrate; and (5) via holes penetrating the insulating layer and connecting the terminal electrode to the embedded electronic part.

3. The wiring substrate according to claim 1, wherein the acid anhydride curing agent, before embedding, has a viscosity at 25° C.±1° C. of not higher than 170 mPa·s.

4. The wiring substrate according to claim 1, wherein the filler contains at least one inorganic filler.

5. The wiring substrate according to claim 2, wherein the acid anhydride curing agent, before embedding, has a viscosity at 25° C.±1° C. of not higher than 170 mPa·s.

6. The wiring substrate according to claim 2, wherein the filler contains at least one inorganic filler.

* * * * *